(12) United States Patent
Minota et al.

(10) Patent No.: US 8,478,129 B2
(45) Date of Patent: Jul. 2, 2013

(54) OPTICAL COMMUNICATION DEVICE, OPTICAL TRANSCEIVER USING THE SAME AND MANUFACTURING METHOD OF OPTICAL COMMUNICATION DEVICE

(75) Inventors: Yuuji Minota, Tokyo (JP); Kazufumi Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 719 days.

(21) Appl. No.: 12/544,776

(22) Filed: Aug. 20, 2009

(65) Prior Publication Data

US 2010/0061735 A1    Mar. 11, 2010

(30) Foreign Application Priority Data

Sep. 9, 2008    (JP) ................... 2008-230438

(51) Int. Cl.
*H04B 10/00*    (2006.01)
(52) U.S. Cl.
USPC .................. 398/139; 398/138; 398/164
(58) Field of Classification Search
USPC .................. 398/138–139, 162–164
See application file for complete search history.

(56) References Cited

U.S. PATENT DOCUMENTS

| | | | |
|---|---|---|---|
| 7,590,357 B2 * | 9/2009 | Sasaki | 398/164 |
| 2004/0081468 A1 * | 4/2004 | Ichihara et al. | 398/164 |
| 2005/0157972 A1 | 7/2005 | Kuhara et al. | |
| 2005/0168957 A1 * | 8/2005 | Kawauchi et al. | 361/749 |
| 2006/0065432 A1 | 3/2006 | Kawauchi et al. | |
| 2006/0133819 A1 * | 6/2006 | Yu et al. | 398/164 |
| 2006/0133821 A1 * | 6/2006 | Wang et al. | 398/164 |

FOREIGN PATENT DOCUMENTS

| | | |
|---|---|---|
| CN | 101170105 A | 4/2008 |
| JP | 2002090586 A | 3/2002 |
| JP | 2002131593 A | 5/2002 |
| JP | 2003086755 A | 3/2003 |
| JP | 2003174176 A | 6/2003 |
| JP | 2004241915 A | 8/2004 |
| JP | 2004347809 A | 12/2004 |
| JP | 2005217284 A | 8/2005 |
| JP | 2006100511 A | 4/2006 |
| JP | 2007067380 A | 3/2007 |
| JP | 2007108542 A | 4/2007 |
| JP | 2007134992 A | 5/2007 |

OTHER PUBLICATIONS

Japanese Office Action for JP2008-230438 mailed on Aug. 14, 2012.
Chinese Office Action for 2009101691167 dated on May 25, 2012.
Japanese Office Action for JP2008-230438 mailed on Oct. 23, 2012.
Japanese Office Action for JP2008-230438 mailed on Jan. 15, 2013.
The Second Chinese Office Action for CN200910169116.7 issued on Jan. 17, 2013.

\* cited by examiner

*Primary Examiner* — Dzung Tran

(57) ABSTRACT

An optical communication device, including a module board which includes at least the optical module inputting or outputting an optical signal, and the peripheral circuit connecting electrically with the optical module; a connector board which includes an electric connector inputting or outputting an electric signal: and a flexible board which adjusts a relative position of the module board and the connector board, and transmits the electric signal among these boards.

12 Claims, 12 Drawing Sheets

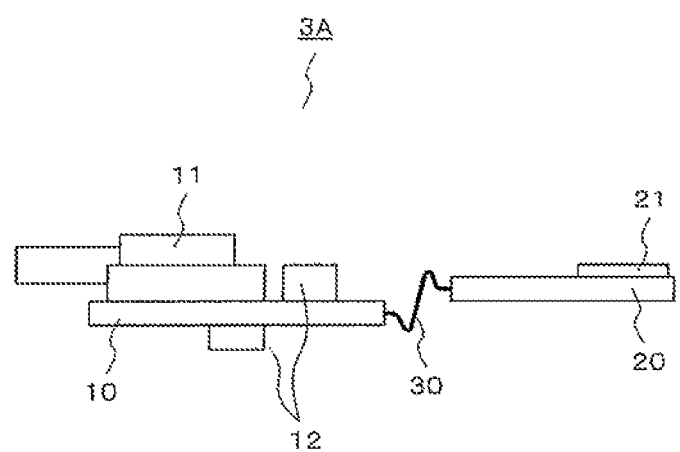

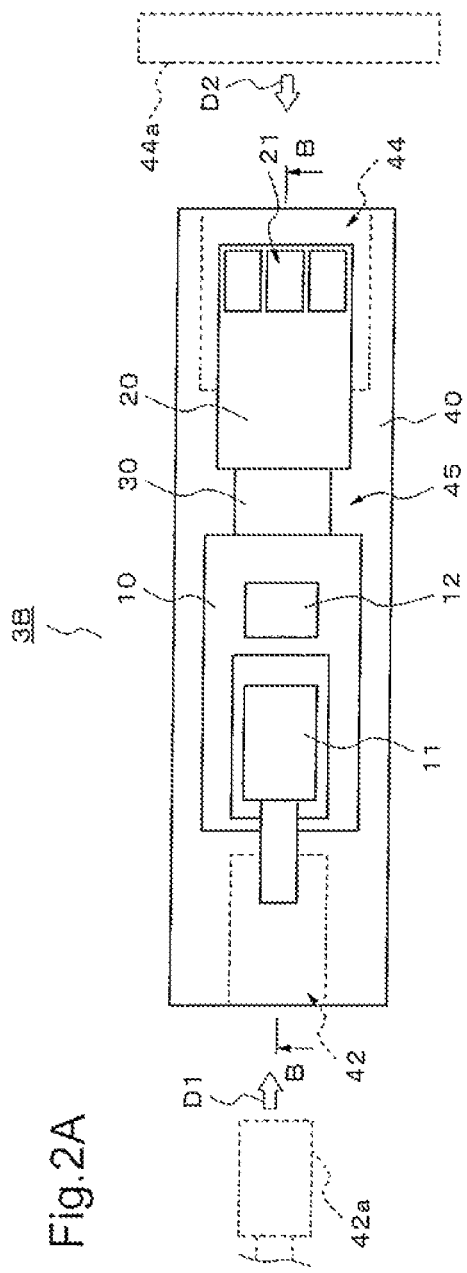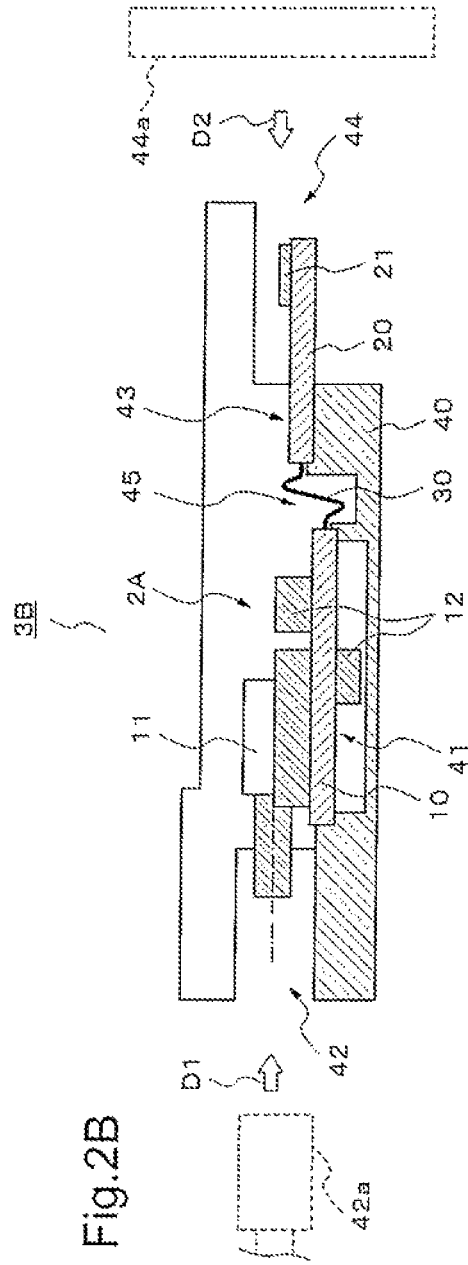

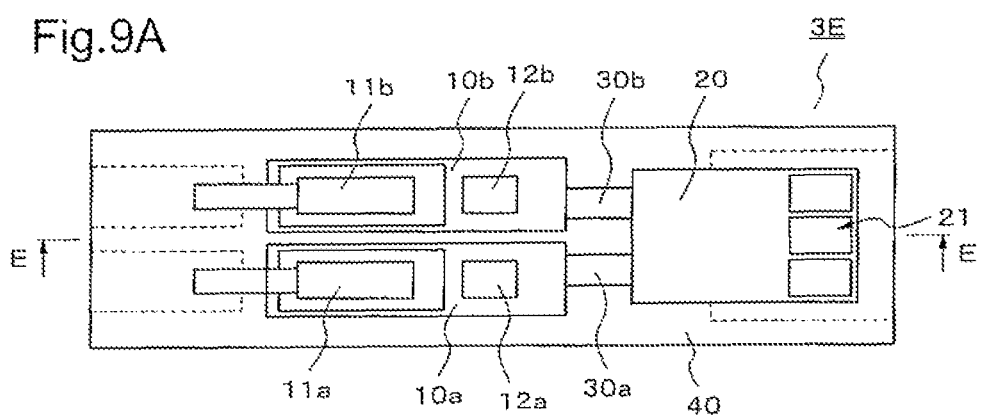
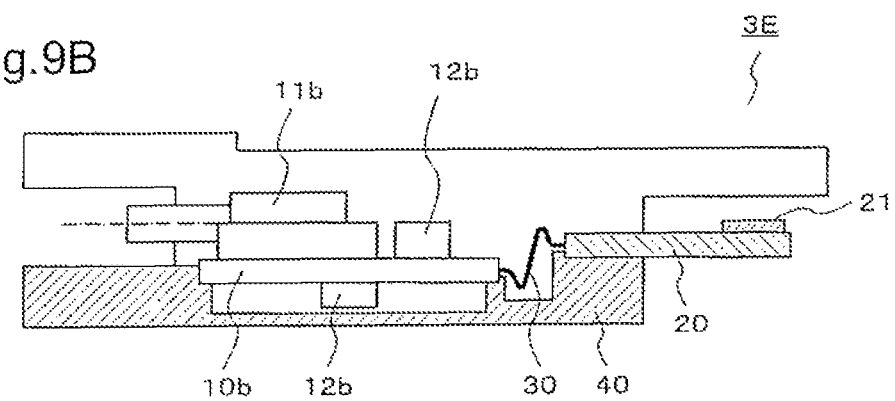

OPTICAL COMMUNICATION DEVICE, OPTICAL TRANSCEIVER USING THE SAME AND MANUFACTURING METHOD OF OPTICAL COMMUNICATION DEVICE

This application is based upon and claims the benefit of priority from Japanese Patent Application No. 2008-230438, filed on Sep. 9, 2008, the disclosure of which is incorporated herein in its entirety by reference.

TECHNICAL FIELD

The present invention relates to an optical communication device used for an optical communication, an optical transceiver using the optical communication device, and manufacturing method of the optical communication device.

BACKGROUND ART

As shown in FIG. 12A and FIG. 12B, an optical transceiver 100 used for the optical communication includes an optical module 101, a printed circuit board 102, an electric connector 103, a case 104, and others. FIG. 12A is a top view of the optical transceiver 100, and FIG. 12B is crosses sectional view along arrow direction at line H-H of the optical transceiver 100 in FIG. 12A.

The optical module 101 includes a laser element which outputs an optical signal, and an optical receiving element which receives the optical signal. In addition, the optical module 101 includes a signal terminal and a power supply terminal which are connected to the laser element and the optical receiving element.

Hereinafter, the signal terminal and the power supply terminal are named the module terminal generically. The optical module 101 is mounted nearby edge of the printed circuit board 102, and the electric connector 103 is formed nearby the other edge. The module terminals 114 of the optical module 101 are inserted into through-hole terminals 115 that are formed in the printed circuit board 102 and are soldered after that. As a result, the optical module 101 is electrically connected with pattern wirings of the printed circuit board 102. Further, the peripheral circuit 105 such as a driving circuit for driving the optical module 101 is mounted on the printed circuit board 102.

The case 104 includes a board mount part 110 for receiving the printed circuit board 102 which mounted the optical module 101, an optical cable mount part 111 with which an optical cable (not shown) is connected, and a communication device mount part 112 with which the communication device (not shown) is connected. Further, the printed circuit board 102 is mounted in the board mount part 110 so as an optical axis Q of the optical module 101 and the optical axis of the optical cable may coincide when the optical cable is attached to the optical cable mount part 111. When the printed circuit board 102 is mounted in the board mount part 110, the electric connector 103 is projected from the communication device mount part 112. A distance between a top surface 102a of the printed circuit board 102 and a top surface K1 of the communication device mount part 112 is predetermined height H1. This height H1 is defined in a specification called MSA (Multi-Source Agreement).

Because the electric connector 103 and the optical module 101 are mounted on the printed circuit board 102, a difference of height H2 between a top surface 102a of the printed circuit board 102 and a top surface K2 of the optical cable mount part 111 is set according to height of the optical module 101. When height of the optical module 101 becomes high, that is, when height H2 becomes high, height H3 of the case 104 becomes high.

Japanese Patent Application Laid-Open No. 2007-67380 discloses an optical transceiver where a printed circuit board and an optical module are mounted on a flexible board.

By using this kind of the flexible board, even if the optical module 101 and the electric connector 103 are set in a different height, it can absorb difference of height between the optical module 101 and the electric connector 103 since the flexible board is deformed. Accordingly, it is possible to lower height of the case 104.

On the other hand, when the module terminals 114 of the optical module 101 are soldered in the through-hole terminals 115 of the printed circuit board 102, a variation may occur to insertion amount of the module terminals 114 that are inserted in the through-hole terminals 115. A variation of the insertion amount of the module terminals 114 is equivalent to a variation of height H4 of the optical module 101 that is measured from the top surface 102a of the printed circuit board 102. Accordingly, the height H3 of the case 104 has to be set considering the variation amount of the height H4 of the optical module 101. Therefore, the height H3 of the case 104 is increased by the variation amount of the height H4 of the optical module 101.

Japanese Patent Application Laid-Open No. 2007-108542 discloses an optical fiber module wherein an optical module is surface mounted on a printed circuit board.

When a surface mounting technology is applied, because height of the optical module 101 from surface of the printed circuit board 102 is almost constant, height of the case 104 of the optical module 101 can be defined without considering variation amounts of the height H4 of the optical module 101. Therefore, it is possible to minimize the height H3 of the case 104.

By the way, due to high-frequency signal that flows between the driving circuit and the optical module, return current flows among them. Therefore, transfer characteristics of the high-frequency signal degrade by the return current. However, Japanese Patent Application Laid-Open No. 2007-67380 and Japanese Patent Application Laid-Open No. 2007-108542 mentioned above does not refer the alignment such as distance between the optical module and the driving circuit. In the case when distance between the driving circuit and the optical module becomes long, because a current path of the high-frequency signal and the return current also becomes long in connection with the distance, degradation amount of the above-mentioned transfer characteristics becomes large.

SUMMARY

An exemplary object of the present invention is to provide an optical communication device that suppresses degradation of transfer characteristics of a high-frequency signal, an optical transceiver using the optical communication device, and a manufacturing method of the optical communication device.

An optical communication device, including a module board which includes at least the optical module inputting or outputting an optical signal, and the peripheral circuit connecting electrically with the optical module; a connector board which includes an electric connector inputting or outputting an electric signal; and a flexible board which adjusts a relative position of the module board and the connector board, and transmits the electric signal among these boards.

The optical communication device, comprising: a first means for including at least the optical module inputting or outputting an optical signal, and the peripheral circuit connecting electrically with the optical module; a second means for including an electric connector inputting or outputting an electric signal and a third means for adjusting a relative position of the module board and the connector board, and transmits the electric signal among these boards.

An optical transceiver, including an optical communication device, further including a module board which includes at least the optical module inputting or outputting an optical signal, and the peripheral circuit connecting electrically with the optical module; a connector board which includes an electric connector inputting or outputting an electric signal: and a flexible board which adjusts a relative position of the module board and the connector board, and transmits the electric signal among these boards; a mount part which receives the optical communication device; and a case, further comprising: a cable connecting part that optically connects the communication cable with the optical module; and a main body connecting part that electrically connects the electrical connector with a main communication device; wherein the optical module transforms the optical signal from the communication cable into electric signal, and outputs to the main communication device via the electric connector; and the optical module transforms the electric signal from the main communication device into the optical signal via the electric connector, and outputs to the communication cable.

A manufacturing method of an optical communication device, including a device arrangement procedure for arranging at least the optical module on the flex-rigid circuit board which includes the module board, the connector board, and the flexible board; and a reflow processing for soldering the optical module to the module board by heating a solder pattern on the module board.

BRIEF DESCRIPTION OF THE DRAWINGS

The Exemplary features and advantages of the present invention will become apparent from the following detailed descriptions when taken in account the accompanying drawings in which:

FIG. 1 is a side view of the optical transceiver according to a first exemplary embodiment of the present invention;

FIG. 2A is a top view of an optical transceiver according to a second exemplary embodiment of the present invention;

FIG. 2B is a cross sectional view along a line B-B of the optical transceiver in FIG. 2A;

FIG. 9A is a top view of the optical transceiver including a first module board and a second module board according to the forth exemplary embodiment:

FIG. 9B is a cross sectional view of arrow direction along a line E-E of the optical transceiver in FIG. 9A;

EXEMPLARY EMBODIMENT

Figure 3:
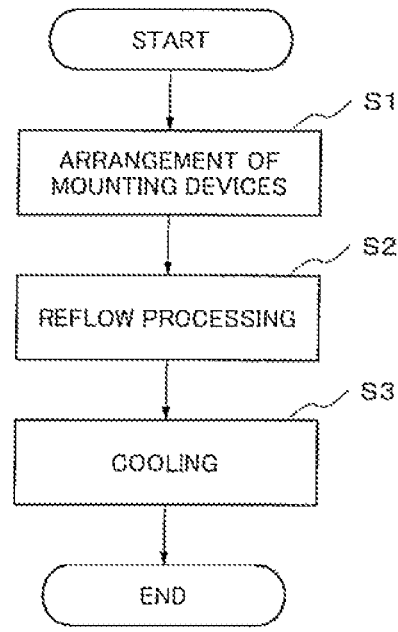
FIG. 3 is a flowchart which indicates a mounting process of mounting devices according to the second exemplary embodiment.

Exemplary embodiments of the present invention are described in detail in accordance with the accompanying diagrams and a flowchart. In following descriptions, although an optical transceiver is explained to an example as an optical communication device, the present invention is not limited to the optical transceiver.

1. First Exemplary Embodiment

FIG. 1 is a side view of an optical transceiver 3A according to a first exemplary embodiment of the present invention. The optical transceiver 3A includes a module board 10, a connector board 20, and a flexible board 30. The module board 10 mounts at least an optical module 11 which an optical signal inputs and/or outputs, and a peripheral circuit 12 electrically connected with the optical module 11. The connector board 20 includes electric connector 21 which an electric signal inputs and/or outputs. The flexible board 30 is arranged between the module board 10 and the connector board 20, and adjusts relative position of the module board 10 and the connector board 20.

Thus, because the peripheral circuit 12 and the optical module 11 are mounted on the module board 10, a path of the high-frequency signal current and a its return current that flows between the peripheral circuit 12 and the optical module 11 becomes short. Therefore, it can suppress degradation of a transfer characteristics of the high-frequency signal of the optical transceiver 3A.

2. Second Exemplary Embodiment

Next, a second exemplary embodiment of the present invention is described. If the second exemplary embodiment includes the same components as the first exemplary embodiment, the second exemplary embodiment uses the same symbols and may omit detailed descriptions. FIG. 2A is a top view of an optical transceiver 3B according to the second exemplary embodiment, and FIG. 2B is a cross sectional view along a line B-B of the optical transceiver 3B in FIG. 2A.

The optical transceiver 33 includes the module board 10, the connector board 20, the flexible board 30 and a case 40. The optical module 11 is surface mounted on the module board 10, and the peripheral circuit 12 such as a driving circuit for the optical module 11 is mounted on it. The electric connector 21 is formed at the edge of the connector board 20.

The module board 10, the connector board 20, and the flexible board 30 make up a flex-rigid circuit board which has a flexibility. The flex-rigid circuit board is, as an example, electrical and mechanical combination of hard rigid board composed of the glass based materials and other materials, and the flexible board composed of a film based materials and other materials.

The case 40 includes a module board mount part (mount part) 41, an optical connector mount part (cable connecting part) 42, a connector board mount part (mount part) 43, a communication device mount part (main connecting part) 44 and a board height adjusting part (mount part) 45. The module board 10 is mounted from the upward of the module board mount part 41. An optical connector 42a is connected with the optical connector mount part 42 from the direction of the arrow D1 which is indicated in FIG. 2B. The connector board 20 is mounted at the connector board mount part 43. A main communication device 44a is connected with the communication device mount part 44 from the direction of the arrow D2 which is indicated in FIG. 2B. The flexible board 30 is located in the board height adjusting part 45. Further, when mounting the module board 10 in the module board mount part 41 and mounting the connector board 20 in the connector board mount part 43, the flexible board 30 curves according to the distance between the module board 10 and the connector board 20.

Figure 4A:
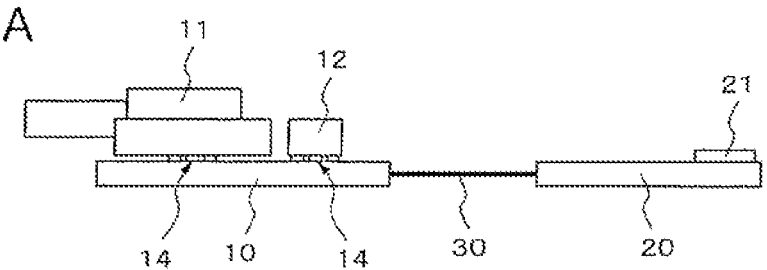
FIG. 4A is a side view of the optical transceiver which is mounted the mounting devices to the module board according to the second exemplary embodiment.
Figure 4B:
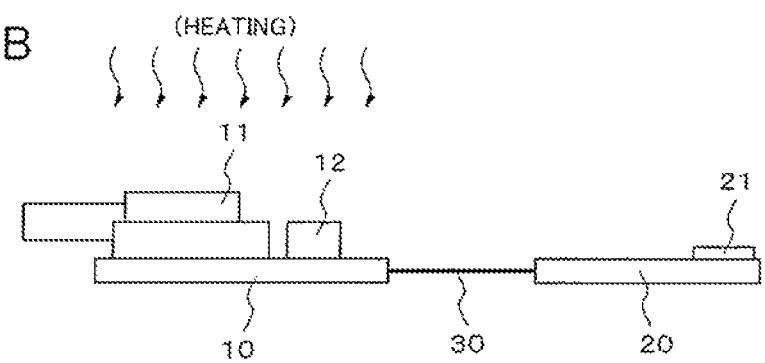
FIG. 4B is a side view of the optical transceiver when connecting the mounting devices to the module board electrically by reflow processing according to the second exemplary embodiment.

Next, a mounting process of the optical module 11 and the peripheral circuit 12 into the module board 10 is explained. Hereinafter, in order to improve clarity of the descriptions, the optical module 11, the peripheral circuit 12, and others to mount are suitably described to be a mounting device. FIG. 3 is a flowchart in which a mounting process of the mounting devices on the module board 10 is indicated. FIG. 4A is a side view of the optical transceiver with which the mounting devices are arranged on the module board, and FIG. 4B is a side view of the optical transceiver with which the mounting devices are electrically connected with the pattern wirings of the module board by reflow processing.

First, as shown in FIG. 4A, the mounting devices such as the optical module 11, the peripheral circuit 12, and others are arranged on the flex-rigid circuit board provided with the soldering pattern 14 (S1 in FIG. 3). Although the mounted devices are mounted on the module board 10, there are not mounted on the connector board 20 and the flexible board 30. That is, the mounting devices which affect the transfer characteristics of the high-frequency signal are assembled and mounted as far as possible on module board 10. Then, the following descriptions focus on the module board 10.

Next, reflow processing is performed. That is, as shown in FIG. 4B, the module board 10 on which the mounting devices are arranged, is heated by hot wind or others means. The solder melts by the heating, wets and spreads the terminal face of mounting devices (S2 in FIG. 3).

After that, by cooling the module board 10 and by solidifying the solder, the mounting devices are electrically connected with the module board 10 (S3 in FIG. 3).

If it requires soldering the mounting devices on reverse surface of the flex-rigid circuit board, then turns over the flex-rigid circuit board and repeats the above mentioned processes Steps S1 to S3.

In Step S1 in FIG. 3, when the mounting devices are arranged on the module board 10, they are floating from board surface of the module board 10. Then, after the reflow processing of Step S2 in FIG. 3, because the solder melts, and wets and spreads the terminal face of the mounting devices, the mounting devices closed to board surface of the module board 10.

The distance from board surface of the module board 10 to the mounting device is decided by the reflow condition (i.e. such as melting temperature of the solder and viscosity of the melted solder), the solder wettability of the terminals of the mounted devices, weight of the mounting devices, and others factors. That solder wettability, weight of the mounting devices, and other factors are decided by kind of the solder and the mounting devices. The viscosity of the melted solder is decided by composition, heating temperature, and heating time of the solder. Therefore, if these conditions are kept constant, the distance from board surface of the module board 10 to the mounting devices can be kept almost constant. That is, by setting up the best condition of the reflow processing, the variation amount of the height of the mounting devices can be minimized. Accordingly, when designing height of the case, it is not necessary to consider the variation amount of height of the mounting devices, and can minimize height of the case. Therefore, it can lower height of the case.

Figure 5:
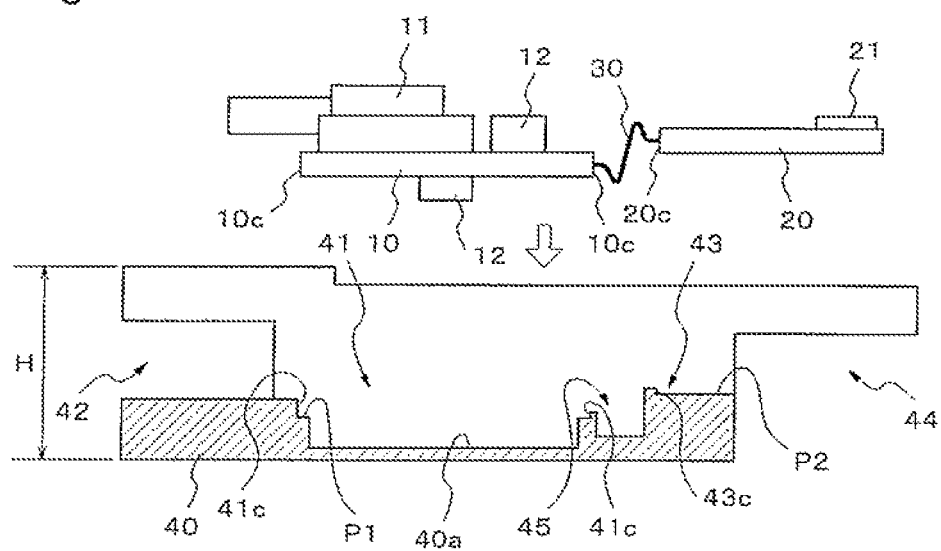
FIG. 5 is a cross sectional view of the optical transceiver when mounting the module board into the case according to the second exemplary embodiment.

Next, with reference to FIG. 5, the process which mounts into the case 40 the flex-rigid circuit board on which the mounted devices are mounted is explained. FIG. 5 is a sectional view of the optical transceiver in the state of mounting the flex-rigid circuit board into case 40. Mounting of the flex-rigid circuit board is performed by curving the flexible board 30, and then making the module board 10 fit into the module board mount part 41, and making the connector board 20 fit into the connector board mount part 43. The module board 10 has a fitting part 10C such as a corner part, a projection part, a notch part, and others, and the module board mount part 41 has a fitting part 41C which fits into the fitting part 10C. When mounting the module board 10 into the module board mount part 41, a position of the module board 10 is fixed to the position of the module board mount part 41 by fitting the fitting part 10C with the fitting part 41C. Similarly, the connector board 20 has the fitting part 20C such as a corner part, a projection part, a notch part, and others. The connector board mount part 43 has a fitting part 43C which fits into the fitting part 20C. Then, when mounting the connector board 20 into the connector board mount part 43, the position of the connector board 20 to the connector board mount part 43 is fixed by making fitting part 20C and fitting part 43C fit in. In this way, by curving the flexible board 30 and fixing the position of the module board 10 and the connector board 20 to the case 40, assembles the optical transceiver.

As shown in FIG. 5, a position P1 of the module board mount part 41 is set at a position close to the bottom 40a of the case 40 than a position P2 of the connector board mount part 43. If the position P1 of the module board mount part 41 and the position P2 of the connector board mount part 43 are the same height, since a height of the optical module 11 which is mounted on the module board 10 is high (large), a height H of the case 40 also becomes high (large). Therefore, as it mentioned above, the position P1 of the module board mount part 41 is positioned close to the bottom 40a of the case 40 and is lower position than the position P2 of the connector board mount part 43. Therefore, the height H of the case 40 becomes low only the vertical interval of the position P1 and the position P2. In this case, the level difference of the module board 10 mounted into the module board mount part 41 and the connector board 20 mounted into the connector board mount part 43 is absorbed because the flexible board 30 curves.

In addition, as shown in FIG. 2A and FIG. 2B, the flexible board 30 absorbs a stress added to the module board 10 at the time when the optical connector 42a is attached or removed, and a stress added to the connector board 20 at the time when the main communication device 44a is attached or removed. Therefore, it can prevent degrading of connected state of the optical transceiver and the optical connector 42a, and/or connected state of the optical transceiver and the main communication device 44a by the stress at the time of insertion and detachment.

Further, the flexible board 30 absorbs an accumulated common difference by transforming it, because the module board 10 fit with the module board mount part 41, and the connector board 20 fit with the connector board mount part 43.

Figure 6A:
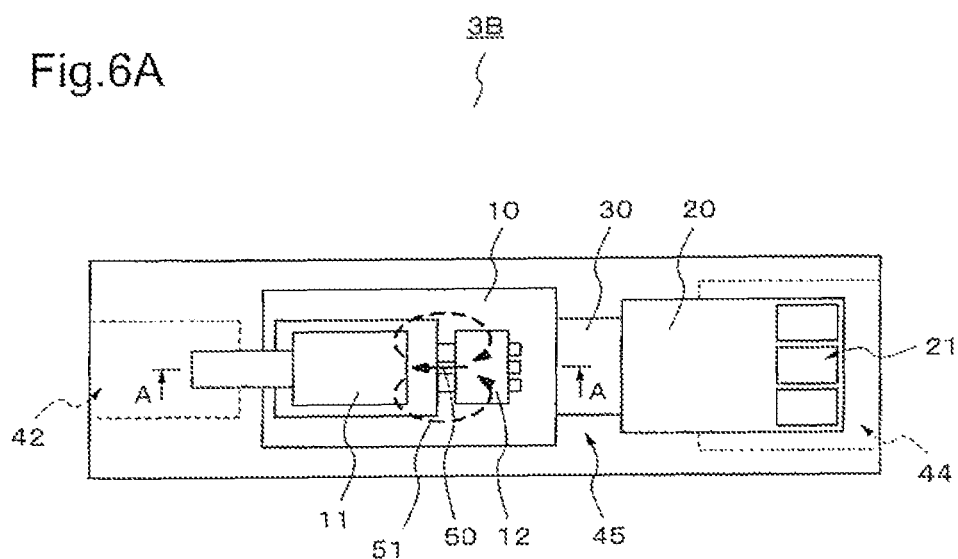
FIG. 6A is a top view of the optical transceiver showing a current path of the high frequency signal according to the second exemplary embodiment.
Figure 6B:
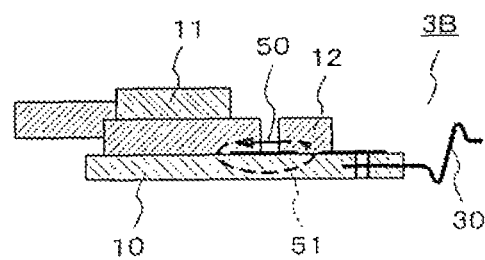
FIG. 6B is a cross sectional view of arrow direction along a line A-A of the optical transceiver in FIG. 6A.

By forming the optical transceiver in such a configuration, the high-frequency characteristics of the optical transceiver are improved. FIG. 6A is a top view of the optical transceiver including the current path of the high frequency signal, and FIG. 6B is a cross sectional view of arrow direction along a line A-A of the optical transceiver in FIG. 6A. An example of this kind of the optical transceivers is specified by SFP (Small Form Factor Pluggable) and XFP (10 Gigabit/sec Small Form Factor Pluggable) and others.

The high-frequency signal 50 flows between the optical module 11 and the peripheral circuit 12, and the return current 51 flows on a ground potential surface corresponding to the high-frequency signal 50. Therefore, due to the return current 51, the transfer characteristics, such as signal transmission rate and others of the high-frequency signal 50, degrade.

If the length of the current path becomes long, a deteriorating degree of the transfer characteristics becomes large. However, as shown in FIG. 6A, by mounting both the optical module 11 and the peripheral circuit 12 on the module board 10 and by closely arranging them, the current path of the high-frequency signal 50 and the return current 51 becomes short. Accordingly, it can suppress serious degradation of the transfer characteristics of the high-frequency signal 50.

3. Third Exemplary Embodiment

Next, a third exemplary embodiment of the present invention is described. If the third exemplary embodiment includes the same components as the second exemplary embodiment, the third exemplary embodiment uses the same symbols and may omit detailed descriptions. According to the second exemplary embodiment, the optical module and the peripheral circuit are mounted on the same module board, and the peripheral circuit is arranged close to the optical module.

Therefore, by shortening the current path of the high-frequency signal which flows between the peripheral circuit and the optical module, and the return current, degradation of the transfer characteristics of the high-frequency signal is suppressed.

As is mentioned above, a signal which inputs and outputs the optical module includes the high-frequency signal which flows between the peripheral circuits in addition to the signal which flows between the flexible board. Because these signals are also the high-frequency signal, the return current is also generated, and the transfer characteristics are degraded.

According to the third exemplary embodiment, as shown in FIGS. 7A to 7D, it sets the difference in a step part 16 in the module board 10, and the optical module 11 is mounted on the lower position. Hereinafter, in order to make it clear the explanation, a first high-frequency signal SG1 denotes the high-frequency signal which flows between the optical module 11 and the peripheral circuit 12, and a second high-frequency signal SG2 denotes the high-frequency signal which flows between the optical module 11 and the flexible board 30. Also, a first return current denotes the return current created by the first high-frequency signal SG1, and a second return current denotes the return current created by the second high-frequency signal SG2.

Figure 7A:
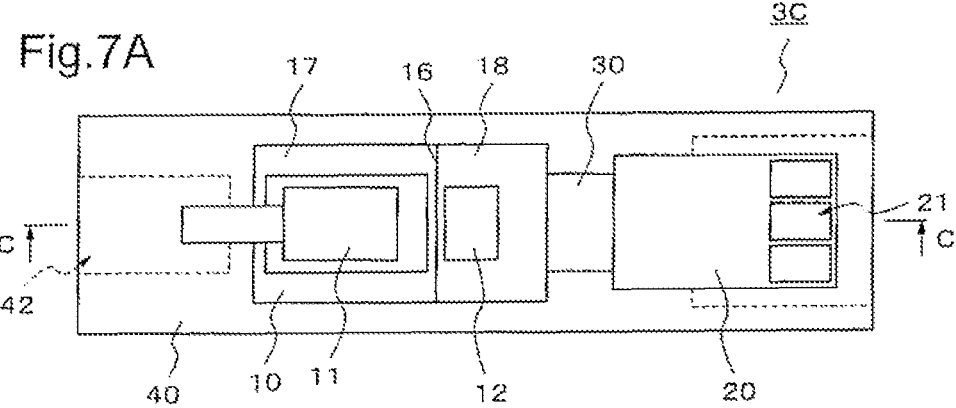
FIG. 7A is a top view of an optical transceiver according to a third exemplary embodiment of the present invention.
Figure 7B:
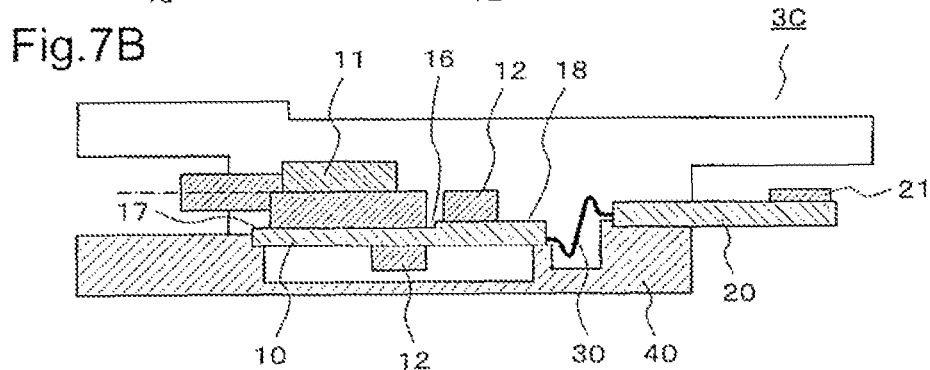
FIG. 7B is a cross sectional view of arrow direction along a line C-C of the optical transceiver in FIG. 7A.
Figure 7C:
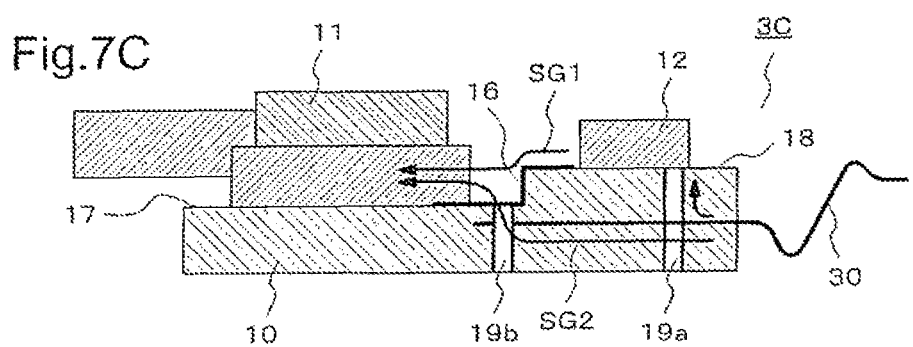
FIG. 7C is a cross sectional view of the optical transceiver showing a current path of a high frequency signal according to the third exemplary embodiment.
Figure 7D:
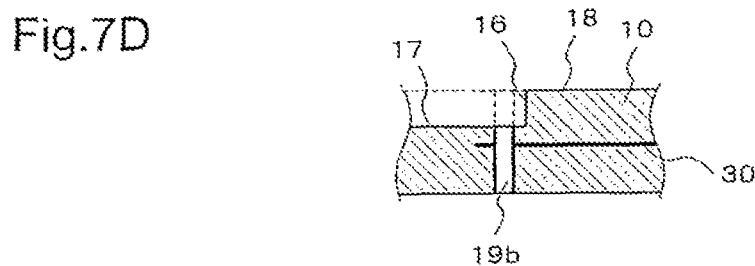
FIG. 7D is a fragmentary cross sectional view of a module board with different thickness according to the third exemplary embodiment.

Further, FIG. 7A is a top view of the optical transceiver, FIG. 7B is a cross sectional view of arrow direction along a line C-C of the optical transceiver in FIG. 7A, FIG. 7C is a cross sectional view of the optical transceiver including the current path of the high frequency signal, FIG. 7D is a fragmentary cross sectional view of a module board with different thickness. In FIG. 7D, a solid line indicates the fragmentary sectional view of the module board 10 when a part of it is thinned down, and a dotted line indicate a fragmentary sectional view of the module board 10 when the part of it is thinned down.

The module board 10 includes the module mount part 17 on which the optical module 11 is mounted, and a peripheral circuit mount part 18 on which the peripheral circuit 12 is mounted. Further, position of the module mount part 17 is lower than the peripheral circuit mount part 18, and height of the difference is equal to the difference in the step part 16.

The module board 10 has a first through-hole terminal 19a that connects the flexible board 30 with the peripheral circuit 12, and a second through-hole terminal 19b that connects the flexible board 30 with the optical module 11. The first through-hole terminal 19a connects pattern wirings of the flexible board 30 with terminals of the peripheral circuit 12 through the peripheral circuit mount part 18. The second through-hole terminal 19b connects pattern wirings of the flexible board 30 with terminals of the optical module 11 through the module mount part 17. Accordingly, length of the second through-hole terminal 19b is shorter than length of the first through-hole terminal 19a, and the difference is equal to the difference in step part 16.

Under such constitution, when the first high-frequency signal SG1 flows between the optical module 11 and the peripheral circuit 12, the first return current caused by the first high-frequency signal SG1 is generated. However, because the optical module 11 and the peripheral circuit 12 are closely arranged, the current path of the first high-frequency signal SG1 and the first return current becomes short. Therefore, it can suppress degradation of the transfer characteristics of the first high-frequency signal SG1. On the other hand, the second high-frequency signal SG2 that flows between the optical module 11 and the flexible board 30 flows via the second through-hole terminal 19b. However, as shown in FIG. 7D, by thinning the module mount part 17, length of the second through-hole terminal 19b is decreased, and the decreased size is equal to difference in step part 16. Accordingly, the current path of the second high-frequency signal SG2 and the second return current becomes short and the shorten size is equivalent to the shorten size of the second through-hole terminal 19b. Therefore, it can suppress degradation of the transfer characteristics of the second high-frequency signal SG2.

As is described above, it is possible to adjust the relative position of the module board to the connector board, even though MSA and other standards specify the position of the electric connectors, because the optical transceiver is formed using the flex-rigid circuit board equipped with the module board, the connector board, and the flexible board. Therefore, the height of the case can be minimized.

Also, the flexible board absorbs stresses added to the module board at a time when the optical connector is attached or removed, and absorbs stresses added to the connector board at a time when the main communication device is attached or removed. Accordingly, it can prevent degrading of connected state of the optical transceiver and the optical connector, and/or connected state of the optical transceiver and the main communication device by the stress at the time of insertion and detachment.

4. Fourth Exemplary Embodiment

Next, a fourth exemplary embodiment of the present invention is described. If the fourth exemplary embodiment includes the same components as the stated above exemplary embodiment, the fourth exemplary embodiment uses the same symbols and may omit detailed descriptions. The optical transceiver in the above exemplary embodiments had the module board, and an optical module was mounted on it.

Figure 8A:
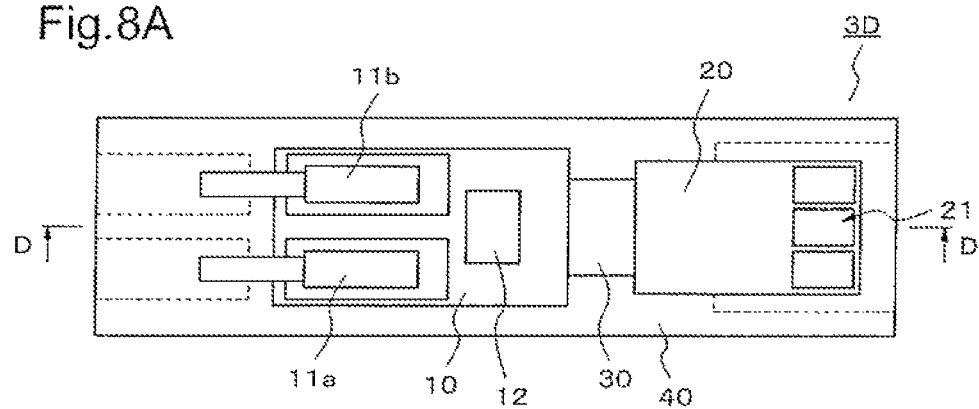
FIG. 8A is a top view of an optical transceiver according to a forth exemplary embodiment of the present invention.
Figure 8B:
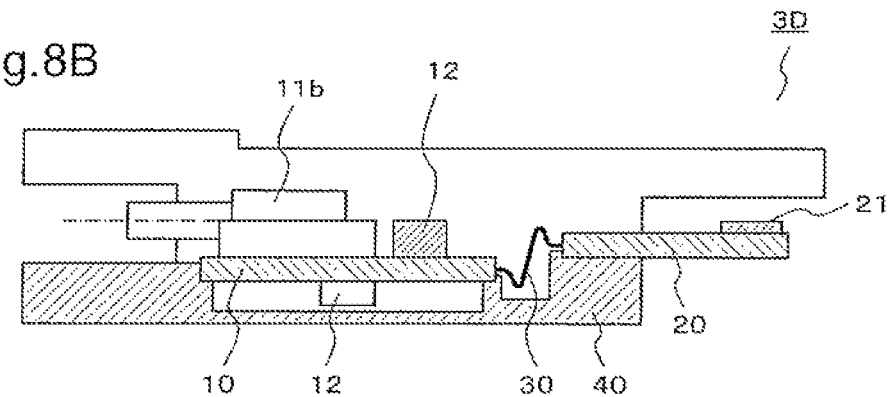
FIG. 8B is a cross sectional view of arrow direction along a line D-D of the optical transceiver in FIG. 8A.

However, as indicated, for example in FIG. 8A and FIG. 8B, the two optical modules of optical module 11a for transmitting and optical module 11b for receiving may be mounted in one module board 10. FIG. 8A is a top view of the optical transceiver 3D equipped with two optical modules 11a and 11b, and FIG. 8B is a cross sectional view of arrow direction along a line D-D of the optical transceiver 3D in FIG. 8A.

In general, it is well know that a transmitting optical module has the laser element which outputs the optical signal, a receiving optical module having the optical receiving element which receives the optical signal, and a transmitting-receiving optical module having both the laser element and the optical receiving element as is shown in FIG. 2 and others. The transmitting optical module and the receiving optical module are cheaper than the transmitting-receiving optical module. Accordingly, the optical module 3D, which is shown in FIG. 8A and FIG. 8B, has the transmitting optical module 11a and the receiving optical module 11b, instead of the transmitting-receiving optical module which is described in FIG. 2. Therefore, it can reduce cost of the optical transceiver 3D. The forth exemplary embodiment does not eliminate using the transmitting-receiving optical module for the optical module 3D. Therefore, when multiple optical module 3D which is the transmitting-receiving optical module are used, the optical transceiver with the multichannel is produced cheaply.

As shown in FIG. 9A and FIG. 9B, the module board can be divided into the first module board 10a and the second module board 10b. FIG. 9A is a top view of the optical transceiver 3E including a first module board 10a and a second module board 10b, and FIG. 9B is a cross sectional view of arrow direction along a line E-E of the optical transceiver in FIG. 9A. The first optical module 11a and a first peripheral circuit 12a are mounted on the first module board 10a, and the second optical module 11b and a second peripheral circuit 12b are mounted on the second module board 10b. The flexible board is divided into a first flexible board 30a and a second flexible board 30b. The first flexible board 30a electrically connects the first optical module 11a and the first peripheral circuit 12a with the electric connector 21, and the second flexible board 30b electrically connects the second optical module 11b and the second peripheral circuit 12b with the electric connector 21.

Under such configuration, when inserting optical connector to the module board 10a (or 10b) or detaching it from the module board 10a (or 10b), even if stresses are added to the module board 10a (or 10b), the stresses are not added to the other module board 10b (or 10a) Accordingly, it can prevent degrading of connected state of the optical transceiver and the optical connector, and/or connected state of the optical transceiver and the main communication device by the stress at the time of insertion and detachment.

Further, it is possible to mount the transmitting optical module on the first module board 10a, and mount the receiving optical module on the second module board 10b. In this case, because it can use inexpensive optical module for transmission and reception, cost of the optical transceiver 3E can be reduced.

Also, it can mount the transmitting-receiving optical module both on the first module board 10a and on the second module board 10b. In this case, it can provide the optical transceiver having multichannel communication path.

Figure 10A:
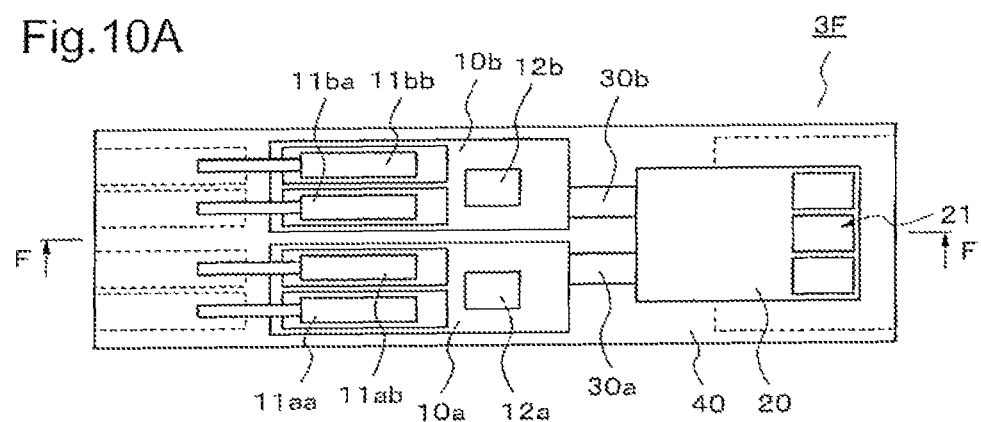
FIG. 10A is a top view of the optical transceiver which divided the module board into a first and a second module boards, and mounted the optical module in each board according to the forth exemplary embodiment.
Figure 10B:
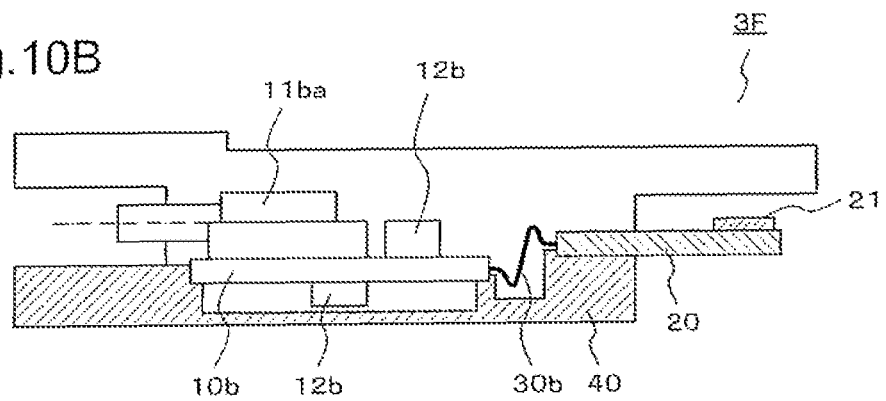
FIG. 10B is a cross sectional view of arrow direction along a line F-F of the optical transceiver in FIG. 10A.

As shown in FIG. 10A and FIG. 10B, the configuration may also includes a case where the module board is divides into the first module board 10a and the second module board 10b, and two optical modules are mounted on the module board 10a and on the second module board 10b respectively. FIG. 10A is a top view of the optical transceiver equipped with two module boards, and FIG. 10B is a cross sectional view of arrow direction along a line F-F of the optical transceiver in FIG. 10A.

The optical modules 11aa and 11ab and the first peripheral circuit 12a are mounted on the first module board 10a, and the optical modules 11ba and 11bb and the second peripheral circuit 12b are mounted on the second module board 10b. The flexible board is divided into the first flexible board 30a and the second flexible board 30b. Further, the first flexible board 30a electrically connects the first peripheral circuit 12a with the electric connector 21, and the second flexible board 30b electrically connects the second peripheral circuit 12b with the electric connector 21.

By dividing the module board, because the stresses caused by insertion and detachment of the optical connector in one module board 10a (10b) will not affects the other module board 10b (10a). If inexpensive modules are used such as transmitting optical module 11ab and 11bb and receiving optical module 11ab and 11bb, cost of the optical transceiver 3F can be reduced. Also, if the transmitting-receiving optical module is used, the optical transceiver having multichannel communication path can be manufacturing.

Figure 11A:
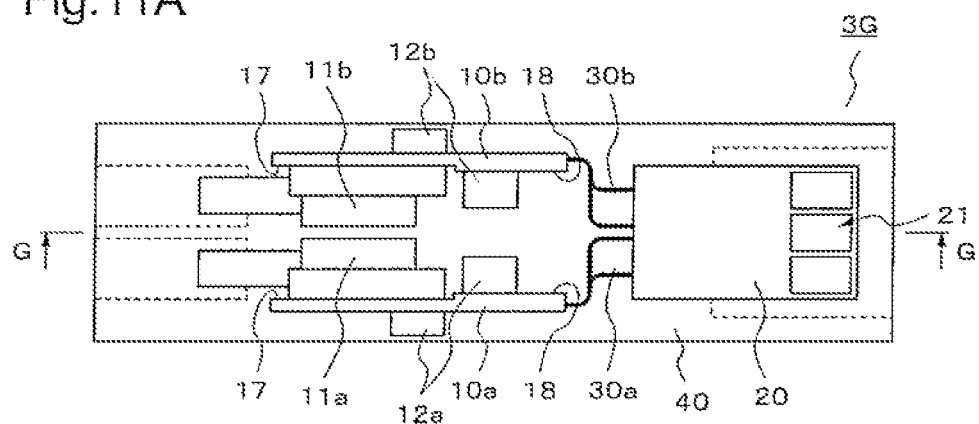
FIG. 11A is a top view of the optical transceiver which is mounted the module board perpendicularly to a board face of a connector board according to the forth exemplary embodiment.
Figure 11B:
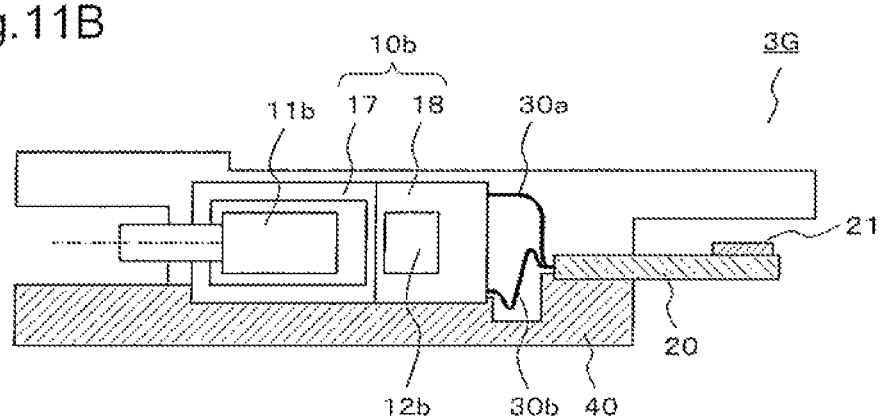
FIG. 11B is a cross sectional view of arrow direction along a line G-G of the optical transceiver in FIG. 11A.
Figure 12A:
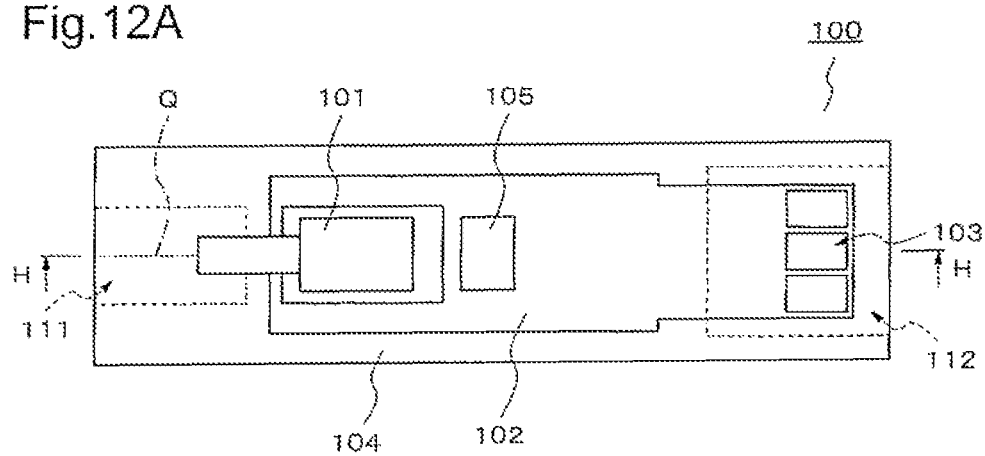
FIG. 12A is a top view of an optical transceiver according to a related art.
Figure 12B:
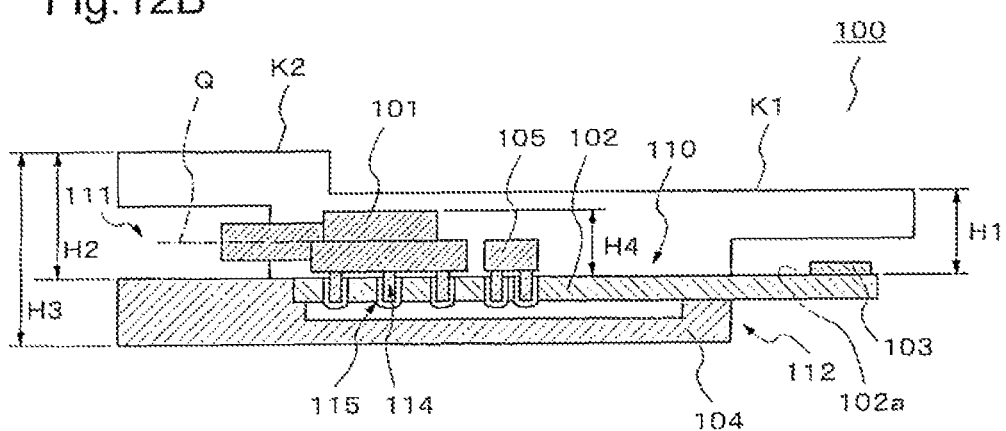
FIG. 12B is a cross sectional view of arrow direction along a line H-H of an optical transceiver in FIG. 12A.

As shown in FIG. 11A and FIG. 11B, it can arrange the module boards 10a and 10b vertically to board surface of the connector board 20. FIG. 11A is a top view of the optical transceiver 3G having the module boards 10a and 10b that are vertically arranged, and FIG. 11B is a cross sectional view of arrow direction along a line G-G of the optical transceiver in FIG. 11A.

In general, height of the peripheral circuits 12a and 12b are lower than height of the optical modules 11a and 11b. Accordingly, upper part of the peripheral circuits 12a and 12b tends to be a dead space. However, by arranging the module boards 10a and 10b vertically to the connector board 20 and opposing them, it is possible to reduce the above-mentioned dead space. Accordingly, the optical transceiver with a high density packaging can be produced.

Further, it does not need to arrange the module boards 10a and 10b vertically to board surface of the connector board 20.

That is, the module boards 10a and 10b should incline to a predetermined angle (in the example, it is 90 degrees) to board surface of the connector board 20 in order to reduce the dead space.

As is described above, the optical transceiver is composed of the flex-rigid circuit board which is consisting of the module boards, the connector boards, and the flexible boards. As a result, even though position of the electric connector is specified by MSA and others, it is possible to adjust relative position of the module boards and the connector boards. Therefore, height of the case can be reduced.

In addition, the flexible board has a buffering function so that stresses, which are added to the module boards at the time when the optical connectors are attached or removed, and are added to the connector boards at the time when the main communication device are attached or removed, are absorbed. Accordingly, loose coupling caused by stresses while inserting and detaching the optical connectors and the main communication devices with the optical transceiver can be reduced.

In addition, because the optical module and the peripheral circuit 12 are mounted closely on the module board, the current path consisting of the high-frequency signal and the return current becomes short. Accordingly, degradation of the transfer characteristics of the high-frequency signal can be improved.

By using combination of the transmitting optical module, the receiving optical module, and the transmitting-receiving optical module for the optical module, the multichannel optical transceiver can be provided. Accordingly, it can reduce size of the optical transceiver and also can reduce the cost.

By dividing the module board and the flexible board, the external force added to one module board does not cause any impacts on the other transmitting-receiving optical module. Accordingly, loose coupling due to stresses added to the optical transceiver, while insertion and detachment of the optical connector and the main communication device, can be reduced.

In addition, by arranging vertically the module board to the connector board, dead space is minimized. Further, it can manufacture the optical transceiver with high density packaging.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents. Further, it is noted that the inventor's intent is to retain all equivalents of the claimed invention even if the claims are amended during prosecution.

The invention claimed is:

1. An optical communication device, comprising:
a module board which includes at least an optical module for inputting and/or outputting an optical signal, and a peripheral circuit connected electrically with the optical module;
a connector board which includes an electric connector for inputting and/or outputting an electric signal; and
a flexible board which adjusts a relative position of the module board and the connector board, and transmits the electric signal among these boards;
wherein the optical module is surface mounted on the module board, and
the module board is formed of one substrate including
a peripheral circuit mount part, having a thickness, which mounts the peripheral circuit,
a module mount part which mounts the optical module while being formed in a substrate thickness thinner than the thickness of the peripheral circuit mount part,
a first through-hole terminal which path through the peripheral circuit mount part and connects wirings of the flexible board and a terminal of the peripheral circuit, and
a second through-hole terminal which path through the module board mount part and connects wirings of the flexible board and a terminal of the optical module, in order that a current loop length of a return current produced between the optical module and the peripheral circuit may become short corresponding to a difference between the thickness of the peripheral circuit mount part substrate thickness of the module mount part.

2. The optical communication device according to claim 1 wherein
a flex-rigid circuit board includes the module board, the connector board, and the flexible board.

3. The optical communication device according to claim 1, wherein
a relative position of the module board and the connector board is adjusted by curving the flexible board.

4. The optical communication device according to claim 1, wherein
the optical module includes at least one of a laser element which outputs laser beam, and an optical receiving element which receive the laser beam.

5. The optical communication device according to claim 1, wherein
the module board is mounted and inclined at a predetermined angle with respect to the connector board.

6. The optical communication device according to claim 1, wherein
a number of the module boards is two or more.

7. The optical communication device according to claim 1, wherein
a number of the optical modules is two or more.

8. An optical communication device, comprising:
a first means for including at least an optical module which inputs or outputs an optical signal, and a peripheral circuit connecting electrically with the optical module;
a second means for including an electric connector which inputs and/or outputs an electric signal; and
a third means for adjusting a relative position of the first means and the second means, and transmitting the electric signal among these boards;
wherein the optical module is surface mounted on the first means, and
the first means is formed of one substrate including
a peripheral circuit mount part, having a thickness, which mounts the peripheral circuit,
a module mount part which mounts the optical module while being formed in a substrate thickness thinner than the thickness of the peripheral circuit mount part,
a first through-hole terminal which path through the peripheral circuit mount part and connects wirings of the third means and a terminal of the peripheral circuit, and
a second through-hole terminal which path through the module board mount part and connects wirings of the third means and a terminal of the optical module, in order that a current loop length of a return current produced between the optical module and the peripheral circuit may become short corresponding to a difference between the thickness of the peripheral circuit mount part and the substrate thickness of the module mount part.

9. The optical communication device according to claim 8, wherein
a relative position of the first means and the second means is adjusted by curving the third means.

10. An optical transceiver, comprising:
an optical communication device, comprising:
a module board which includes at least an optical module for inputting and/or outputting an optical signal, and a peripheral circuit connecting electrically with the optical module;
a connector board which includes an electric connector inputting and/or outputting an electric signal; and
a flexible board which adjusts a relative position of the module board and the connector board, and transmits the electric signal among these boards; and
a case, comprising:
a mount part which receives the optical communication device;
a cable connecting part that optically connects a communication cable with the optical module; and
a main body connecting part that electrically connects an electrical connector with a main communication device;
wherein:
the optical module transforms the optical signal received via the communication cable into electric signal, and provides an output to the main communication device via the electric connector; and
the optical module transforms the electric signal received from the main communication device via the electric connector into the optical signal, and provides an output to the communication cable;
the optical module is surface mounted on the module board; and
the module board is formed of one substrate including
a peripheral circuit mount part, having a thickness, which mounts the peripheral circuit,
a module mount part which mounts the optical module while being formed in a substrate thickness thinner than the thickness of the peripheral circuit mount part,
a first through-hole terminal which path through the peripheral circuit mount part and connects wirings of the flexible board and a terminal of the peripheral circuit, and
a second through-hole terminal which path through the module board mount part and connects wirings of the flexible board and a terminal of the optical module, in order that a current loop length of a return current produced between the optical module and the peripheral circuit may become short corresponding to a difference between the thickness of the peripheral circuit mount part and the substrate thickness of the module mount part.

11. A manufacturing method of an optical communication device, comprising:
a device arrangement procedure for arranging at least an optical module on a flex-rigid circuit board which includes a module board, a connector board, a the flexible board; and
a reflow procedure for soldering the optical module to the module board by heating a solder pattern on the module board;
wherein the optical module is surface mounted on the module board, and
the module board is formed of one substrate including
a peripheral circuit mount part, having a thickness, which mounts the peripheral circuit,
a module mount part which mounts the optical module while being formed in a substrate thickness thinner than the thickness of the peripheral circuit mount part,
a first through-hole terminal which path through the peripheral circuit mount part and connects wirings of the flexible board and a terminal of the peripheral circuit, and
a second through-hole terminal which path through the module board mount part and connects wirings of the flexible board and a terminal of the optical module, in order that a current loop length of a return current produced between the optical module and the peripheral circuit may become short corresponding to a difference of between the thickness of the peripheral circuit mount part and the substrate thickness of the module mount part.

12. The manufacturing method of the optical communication device according to claim 11, further comprising
an assembly process for mounting in the case the flex-rigid circuit board to which the optical module is soldered while curving the flexible board and adjusting the relative position of the module board and the connector board.

* * * * *